United States Patent [19]

Kanamura et al.

[11] Patent Number: 4,943,477
[45] Date of Patent: Jul. 24, 1990

[54] CONDUCTIVE SHEET HAVING ELECTROMAGNETIC INTERFERENCE SHIELDING FUNCTION

[75] Inventors: Tomotsugu Kanamura; Toshihiko Shibata; Yasuji Inoue, all of Aichi, Japan

[73] Assignee: Mitsubishi Rayon Co., Ltd., Tokyo, Japan

[21] Appl. No.: 249,932

[22] Filed: Sep. 27, 1988

[51] Int. Cl.$^5$ .............................................. B32B 27/00
[52] U.S. Cl. ................................ 428/286; 174/35 MS; 428/288; 428/296; 428/297
[58] Field of Search ............... 428/288, 297, 280, 457, 428/286, 296; 174/35 MS

[56] References Cited

U.S. PATENT DOCUMENTS 4,684,762  8/1987  Gladfelter ...................... 174/35 MS
4,781,971  11/1988  Marikar .............................. 428/288

FOREIGN PATENT DOCUMENTS 0027480  7/1980  Japan ............................. 174/35 MS
62-018799  10/1986  Japan .
61-225398  1/1987  Japan .

Primary Examiner—Marion C. McCamish
Attorney, Agent, or Firm—Sughrue, Mion, Zinn, Macpeak & Seas

[57] ABSTRACT

A conductive sheet is disclosed, which consists of a nonwoven fabric consisting of 40 to 90 wt % of a heat fusible fiber comprising a vinyl chloride/vinyl acetate copolymer and 10 to 60 wt % of a metal-plated fiber having a fiber diameter of 3 to 50 $\mu$m and an aspect ratio of 1,000 to 10,000, wherein the nonwoven fabric is hot-press molded and wherein the conductive sheet has a metal content of 2 to 30% by weight and a specific volume of at most 2 cm$^3$/g. The conductive sheet has excellent electromagnetic interference shielding and electrical control effects.

10 Claims, No Drawings

CONDUCTIVE SHEET HAVING ELECTROMAGNETIC INTERFERENCE SHIELDING FUNCTION

FILED OF THE INVENTION

This invention relates to a conductive sheet with excellent electromagnetic interference shielding and electrical control effects, suitably used for frame and housing materials of electronic equipment and the like.

BACKGROUND OF THE INVENTION

Interference due to electromagnetic waves and static electricity has become of problem with the prevail of electronic equipment. In order to prevent the interference, such as electroconductive coating compositions, conductive plastics added by fillers, and nonwoven fabric containing metal fibers are suggested. For example, JP-A-61-225398 (the term "JP-A" as used herein means an "unexamined published Japanese patent application") discloses a sheet material comprising 10 to 85% by weight of metallic fiber, 10 to 85% by weight of fibrous binder, and 0 to 70% by weight of nonmetallic fiber, and JP-A-62-18799 discloses a material comprising a nonwoven fabric comprising at least 40% by weight of metallic fiber at the fiber weight of at least 20 g/m². Among them, nonwoven fabric is advantageous in that they are lightweight, flexible, and that they have high productivity.

The nonwoven fabric can attain relatively easily the electrical control performances, however, the constituent fibers are apt to be randomly oriented and give bulkiness and highly porous structure. Therefore, the following problems are encountered:

(1) Electroconductive performance and electromagnetic interference shielding effect are not sufficiently high, (2) It is necessary to add a large amount of electroconductive fiber to obtain sufficiently high electroconductive performance and electromagnetic interference shielding effect, resulting in increased cost and low workability or at the worse, in unabled formation of the nonwoven fabric; and (3) It is inferior in shape stability and workability of the shaped product, and also the fuzzy appearance ascribed to the fiber limits the application.

Further, since electronic equipments are used indoors and in ships, automibiles, etc., properties such as fire retardation and the like, and moldability according to the application are required for electromagnetic interference shielding materials. No such material meeting the demand is obtained at the present.

SUMMARY OF THE INVENTION

The present inventors made an intensive study to obtain a material filling such demands on high level of electroconductive performances and electromagnetic interference shielding effects and finally attained the present invention.

A object of the present invention is to provide a conductive sheet excellent in electroconductive performance and electromagnetic interference shielding effect.

Another object of this invention is to provide a conductive sheet having together shape stability, with a fuzz-free appearance, and also possessing an excellent fire retardant properties.

The above-mentioned objects of the invention have been attained by a conductive sheet having an electromagnetic interference shielding function, which consists of a nonwoven fabric consisting of 40 to 90 wt% of a heat fusible fiber comprising a vinyl chloride/vinyl acetate copolymer and 10 to 60 wt% of a metal-plated fiber having a fiber diameter of 3 to 50 μm and an aspect ratio of 1,000 to 10,000, wherein the nonwoven fabric is hot-press molded and wherein the conductive sheet has a metal content of 2 to 30% by weight and a specific volume of at most 2 cm³/g.

DETAILED DESCRIPTION OF THE INVENTION

The metal-plated fiber of the present invention is obtained by electroless plating a base fiber with a conductive metal. As the base fibers, synthetic fibers, for example, acrylic fibers and polyester fibers, preferably acrylic fibers are used. Specific examples of the conductive metal include nickel and copper.

The electroless plating as used herein is a method to form a metal coating film on the surface of the base fiber by chemical reaction of the metal ion using a reducing agent (e.g., hydrazine, sodium hypophosphite, sodium boron hydride, formalin).

The ratio of the metal to be used for plating on the base fiber is chosen in the range of 10 to 50% by weight of the metal-plated fiber. In view of workability and stability of the nonwoven fabric and in order to obtain a homogeneous metal coating film, preferable is about 20% by weight.

In addition, in view of processability in the manufacturing process of the nonwoven fabric and in order to obtain a high density sheet having larger number of contact points of metal-plated fiber, the metal-plated fibers of the present invention must have a fiber diameter of 3 to 50 μm, preferably 5 to 20 μm and an aspect ratio, i.e., the fiber length to the fiber diameter ratio, of 1,000 to 10,000, preferably 2,000 to 6,000.

Further, flat fibers may safely be used as the base fiber. If the fiber thickness of the metal-plated fiber is equal, the surface resistance is lowered with increasing flattening in the cross section of the fiber, and results in higher electromagnetic interference shielding effect.

A larger flattening in the cross section of the fiber is preferred so far the spinning is possible, with the ratio of the longer edge of the flattened part to the shorter edge being 4 or more, and the flattened part may comprise a part of the cross section of the fiber.

The metal-plated fiber comprising base fibers having flat cross section is parallel-oriented to the sheet surface by hot-press molding. Therefore, the flat space is considerably reduced and form a dense network of metal-plated fibers.

As the heat fusible fiber, a vinyl chloride/vinyl acetate-based copolymer, preferably a copolymer of 82 to 90% by weight of vinyl chloride and 10 to 18% by weight of vinyl acetate is used. Specific examples of the heat fusible fiber are VINYON made by Hoechst Celanese Inc. of U.S. and MP-Fibre made by Wacker-Chemie GmbH of West Germany. The heat fusible fiber to be used in the present invention comprises a vinyl chloride-based copolymers. This fiber is fire retardant, therefore, the sheet may also be redered fire retardant. Further, the sheet comprising the above heat fusible fiber is successfully fused with other moldings, especially with vinyl chloride resin moldings.

As above mentioned, conventional nonwoven fabric possesses a bulkiness and porous structure.

Accordingly, in the present invention, a nonwoven fabric is once manufactured by mixing in a high rate a heat fusible fiber with a metal-plated fiber, and the resulting fabric is hot-press molded. Thus the heat fusible fiber is fused to effect dense and monolithic adhesion or bonding of the constituting fibers to increase the density. This process gives a dense structured sheet having a specific volume of 2 cm$^3$/g of less. In this sheet structure, the contact points of the metal-plated fibers are increase and fixed. The sheet of the present invention contains 2 to 30% by weight of conductive metal, and not only the state of the metal-plated fiber present in the sheet but also the high concentration of the metal are effective to obtain high level of electroconductive performance and electromagnetic interference shielding effect.

The nonwoven fabric which is the intermediate of the sheet of the present invention consists of 40 to 90% by weight of a heat fusible fiber and 10 to 60% by weight of a metal-plated fiber. It is desirable to predetermine the metal content of the sheet at the manufacturing of the nonwoven fabric, based on the metal content and mixing ratio of the metal-plated fiber to be used.

In the manufacturing of the nonwoven fabric, preferably employed is a dry-carding method, but also applicable is a wet paper machining method. The latter method, however, is difficult to apply on metal-plated fibers having large aspect ratios.

In the heat-press molding of the nonwoven fabric to obtain the sheet of the present invention, any method being capable of simultaneously applying the heat and pressure can be employed. Calenders, laminators, fusing press, etc., are examples which can be suitably applied. Heating temperature is generally set at a temperature around the softening point of the heat fusible fiber to be contained in the nonwoven fabric. The pressure and the duration are appropriately set. Preferably, the heat-press molding is performed under the condition of 80-200° C. heating temperature, 0.4-15 kg/cm$^2$ pressure, and 4 sec. to 5 min. duration. The electroconductive performance of the sheet is desirably controlled by pressure, whereas the film formation on the sheet surface is preferably controlled by the treatment duration.

It is also possible to form a film on one side of the sheet with leaving the shape of the constituting fibers on the other side by heating only one side at the hot-press molding.

It is also possible to render the sheet fire retardant with LOI (Limit Oxygen Index) value of 25 or more to the sheet if the base fiber for the metal-plated fiber is a normal acrylic fiber containing 85% by weight or more of acrylonitrile. Further, if the so-called fire retardant acrylic fibers such as modacrylic fibers and acrylic fibers comprising acrylonitrile/vinylidene chloride copolymer are employed, the fire retardant property of the heat fusible fiber synergetically works to render the sheet fire retardant, giving LOI value of 30 or more to the sheet. The LOI (Limit Oxygen Index) value was measured according to the ASTM-D2863 standard, and larger values indicate higher fire retardation.

In the application field in which electroconductivity and electromagnetic interference shielding effect is required, generally demanded at the same time is fire retardant properties. Therefore, rendering the sheet fire retardant is very useful.

The sheet of the present invention can be used as a sheet material as it is. It can also be used as a molding material to be used singly or in combination with other thermoplastic resins to give a composite to be molded as desired.

The present invention is explained in greater detail with the following non-limiting examples.

The measurements were made according to the methods as follows.

Electromagnetic Interference Shielding Effect:

The method for measurement of electromagnetic interference shielding effect comprises the steps of, in a shieldbox (15 cm $\times$ 15 cm) made of 5 mm thick copper plate, generating an electromagnetic wave from an electromagnetic wave transmitter through a transmitting antenna, and measuring the strength of the electromagnetic wave received by a receiver opposing to the transmitting antenna through an receiving antenna, in case of the presence of a shielding material and in case of the absence of a shielding material. Thus the shielding effect (dB) is measured by the following equation.

Shielding effect (dB) $= 20 \log (E_1/E_2)$ ($E_1$: receiving level at 1,000 MHz when no shielding material is provided between transmitting antenna and receiving antenna; $E_2$: receiving level at 1,000 MHz when a shielding material is provided between transmitting antenna and receiving antenna)

(Rating for the shielding effect)

0 – 10 dB: Very little shielding

– 20 dB: Minimum range meaningful shielding

30 – 60 dB: Good shielding will solve all mild and moderate problem

60 – 90 dB: Excellent shielding will solve moderate to severe problems

90 – 120 dB: Maximum possible will best shielding designs (described in *Seni-Kikai Gakkai Shi*(*Journal of the fiber mechanical society*), Vol. 38, No. 9 (1985), p. 395)

Electroconductive Performance:

The surface electric resistance ($\Omega/\square$) was measured with a surface resistance meter Loresta manufacture by Mitsubishi Petrochemical Co., Ltd. The surface resistance shows resistance in case of that electric charge is transferred along by charged body surface. Accordingly, the smaller the surface resistance is, the higher the electroconductive performance shows. The surface resistance values of 350 $\Omega/\square$ or less are preferred for the present invention.

The surface resistance is calculated by holding two gold-plated pins (2 mm diameter) to a specimen at intervals of 10 mm under a fixed load, and measuring voltage when charging the specimen with fixed electricity. In this case, the value is shown as the average value with respect to the vertical direction and the horizontal direction to the specimen.

Moldability:

The sample was loaded on a mold and pressed with a press machine to give the contents, and the moldability of the contents was indicated as follows.

O: Good

Δ: Moderate

×: Bad

Fire Retardancy:

Measured according to the ASTM D-2863 (corresponding to JIS K-7201) standardized method and given in LOI (Limit Oxygen Index) value.

EXAMPLE 1

VINYON (a vinyl chloride/vinyl acetate copolymer (85 wt%/ 15 wt%) fiber with a denier of 3D and a length of 51 mm, having a softening point of 80° C.; manufactured by Hoechst Celanese Inc. of U.S.) was employed as a heat fusible fiber, and VONNEL (an acrylic fiber consisting of 93 wt% acrylonitrile and 7 wt% vinyl acetate, made by Mitsubishi Rayon Co., Ltd.) was plated with nickel for 25% by weight by electroless plating to give a nickel-plated acrylic fiber (13.5 μm in fiber diameter, 38 mm in length, and 2,815 in aspect ratio).

A nonwoven fabric was manufactured by changing the mixing ratio using a dry-carding method. The nonwoven fabric was hot-press molded using a fusing press at 140° C. under pressure of 1.5 kg/cm² for 4 minutes to give a sheet.

The sheet performance of the product are shown in Table 1. Excellent electroconductive performances and electromagnetic interference shielding effect were obtained for the sheets containing 40 to 90% of heat fusible fiber (Samples 1 –8).

The performance of a nonwoven fabric made of only nickel-plated acrylic fiber is also shown in Table 1 for comparison (Comparative Samples 12 and 13).

The nickel-plated acrylic fiber was obtained by a process as follows:

(1) Degreasing

Immersion-treated in an aqueous solution containing 0.5 g/liter of SCOUROL 700 (a nonionic surfactant made by Kao Corporation) at 98° C. for 2 hours.

(2) Sensitizing

Immersion-treated in an aqueous solution containing 10 g/liter of stannous chloride and 8 ml/liter of 35 wt% hydrochloric acid aqueous solution at 25° C. for 3 minutes.

(3) Activation

Immersion-treated in an aqueous solution containing 0.3 g/liter of palladium chloride and 2 ml/liter of 35 wt% hydrochloric acid aqueous solution at 30° C. for 15 minutes.

(4) Chemical Plating

Immersion-treated in a plating solution containing 27.5 g/liter of nickel chloride, 60 g/liter of sodium citrate, 60 ml/liter of hydrazine, and 5 g/liter of caustic soda at 85° C. for 20 minutes.

TABLE 1

| Run No. | Heat Fusible Fiber (wt %) | Nickel-Plated Acrylic Fiber (wt %) | Nickel Content (wt %) | Sheet Weight (g/m²) | Sheet Thickness (mm) | Specific Volume (cm³/g) | Electromagnetic Interference Shielding Effect Electric Field (dB) | Magnetic Field (dB) | Surface Resistance (Ω/ ) | Moldability |
|---|---|---|---|---|---|---|---|---|---|---|
| Sample 1 | 90 | 10 | 2.5 | 790 | 0.93 | 1.18 | 36.4 | 37.1 | 330 | O |
| Sample 2 | 80 | 20 | 5.0 | 805 | 1.10 | 1.37 | 40.6 | 45.4 | 92–150 | O |
| Sample 3 | 70 | 30 | 7.5 | 810 | 0.90 | 1.11 | 54.7 | 54.3 | 20–40 | O |
| Sample 4 | 60 | 40 | 10.0 | 805 | 1.04 | 1.29 | 68.2 | 74.6 | 9–10 | O |
| Sample 5 | 60 | 40 | 10.0 | 410 | 0.44 | 1.07 | 58.1 | 59.1 | 10–15 | O |
| Sample 6 | 60 | 40 | 10.0 | 105 | 0.13 | 1.24 | 31.2 | 39.7 | 11–18 | O |
| Sample 7 | 50 | 50 | 12.5 | 807 | 1.12 | 1.39 | 58.1 | 52.3 | 12–17 | O |
| Sample 8 | 40 | 60 | 15.0 | 811 | 1.00 | 1.23 | 51.6 | 49.1 | 24–40 | O |
| Comparative Sample 9 | 30 | 70 | 17.5 | 803 | 1.04 | 1.30 | 39.6 | 29.8 | 430–550 | Δ |
| Sample 10 | 20 | 80 | 20.0 | 815 | 1.23 | 1.51 | 30.6 | 20.0 | 500–700 | X |
| Sample 11 | 10 | 90 | 22.5 | 808 | 1.18 | 1.46 | 30.1 | 17.5 | 520–840 | X |
| Sample 12 | 0 | 100 | 25.0 | 800 | 3.54 | 4.43 | 34.0 | 20.5 | 6–12 | X |
| Sample 13 | 0 | 100 | 25.0 | 110 | 0.56 | 5.09 | 16.0 | 12.2 | 10–20 | X |

COMPARATIVE EXAMPLE

Fabrication of a nonwoven fabric containing 60 wt% of heat fusible fiber as used in Example 1 and 40 wt% of stainless steel fiber (8 μm in fiber diameter, 50 mm in length, and 6,250 in aspect ratio, made by Nippon Seisen Co., Ltd.) was attempted using a dry-carding method. The attempt, however, was in vain since the fiber was not homogeneously dispersed and considerable falling-off occurred.

Also, the precessability was too poor to obtain a homogeneous nonwoven fabric.

EXAMPLE 2

An acrylic fiber comprising an acrylonitrile vinylidene chloride copolymer (15 wt% vinylidene chloride) was employed for the base fiber as an alternative to that of the nickel-plated acrylic fiber used in Example 1, and effected nickel plating as in Example 1 to obtain a nickel-plated acrylic fiber having a fiber diameter of 15.6 μm, fiber length of 51 mm, and an aspect ratio of 3,269. A sheet was obtained by following the same process as described in Example 1.

The comparative examples in Table 2 were obtained on samples using a polyester fiber (with denier of 4D and fiber length of 51 mm; softening point: 110° C.) and a polypropylene fiber (with denier of 3D and fiber length of 64 mm; softening point: 130° C.) as the heat fusible fiber.

TABLE 2

| Run No. | Heat Fusible Fiber (wt %) | Ni-Plated Acrylic Fiber (wt %) | Nickel Content (wt %) | Sheet Weight (g/m²) | Sheet Thickness (mm) | Specific Volume (cm³/g) | Electromagnetic Interference Shielding Effect Electric Field (dB) | Magnetic Field (dB) | Surface Resistance (Ω/ ) | LOI Value (%) |
|---|---|---|---|---|---|---|---|---|---|---|
| Sample 4 | VCl/VAc* (60) | AN** (40) | 10.0 | 805 | 1.04 | 1.29 | 68.2 | 74.6 | 9–10 | 28 |
| Sample 14 | VCl/VAc* (60) | AN/VdCl*** (40) | 10.0 | 810 | 0.98 | 1.21 | 69.4 | 75.0 | 9–10 | 31 |

TABLE 2-continued

| Run No. | Heat Fusible Fiber (wt %) | Ni-Plated Acrylic Fiber (wt %) | Nickel Content (wt %) | Sheet Weight (g/m²) | Sheet Thickness (mm) | Specific Volume (cm³/g) | Electromagnetic Interference Shielding Effect | | Surface Resistance (Ω/ ) | LOI Value (%) |
|---|---|---|---|---|---|---|---|---|---|---|
| | | | | | | | Electric Field (dB) | Magnetic Field (dB) | | |
| Comparative Sample 15 | Polyester base (60) | AN** (40) | 10.0 | 818 | 1.70 | 2.08 | 51.6 | 55.7 | 25–40 | 19.5 |
| Comparative Sample 16 | Polypropylene base (60) | AN** (40) | 10.0 | 821 | 1.63 | 1.99 | 41.9 | 43.4 | 42–52 | 18.5 |

*VCl/VAC: Vinyl chloride/vinyl acetate
**AN: Acrylic fiber
***AN/VdCl: Vinylidene chloride copolymerized acrylic fiber

EXAMPLE 3

As acrylic fiber having a flat cross section with flattening of 13, and a one having a Y-type cross section with branches each having a flattening of 4, were nickel-plated to 20 wt% by electroless plating to give a nickel-plated fibers having 34.8 μm in fiber diameter, 100 mm in fiber length, and 2,874 in aspect ratio. A mixture containing 40% by weight of thus obtained nickel-plated fiber and 60% by weight of heat fusible fiber as used in Example 1 was fabricated into a nonwoven fabric by the dry-carding method, and subjected to hot-press molding using a laminator at 165° C., under pressure of 4 kg/cm², and a processing speed of 5 m/min. The performance data of the sheets is given in Table 3.

As for reference, performance values for an example employing a nickel-plated acrylic fiber having 34.8 μm in fiber diameter and 100 mm in fiber length obtained by nickel plating an acrylic fiber having a normal cross section (with flattening of 1.6) are given in Table 3.

EXAMPLE 4

A sheet was fabricated following the method as described in Example 1 except that VINYON (a vinyl chloride/vinyl acetate copolymer fiber having a denier of 3D and fiber length of 51 mm) was used as the heat fusible fiber and that VONNEL (a copper-plated acrylic fiber with an electroless plating of 25% by weight; 13.5 μm in fiber diameter, 51 mm in fiber length, and 3,778 in aspect ratio) was used for the meal-plated fiber.

The performance of thus obtained sheet is as shown in Table 4.

The copper-plated acrylic fiber was obtained by a process as follows.

(1) Degreasing, (2) Sensitizing, and (3) Activating were performed under the same conditions as employed in Example 1.

(4) Plating

Immersion-treated in a plating solution comprising 7 g/liter of copper sulfate, 20 g/liter of Rochelle salt, 5 g/liter of caustic soda, 2 g/liter of sodium carbonate, and 25 ml/liter of formalin at 20° C. for 30 minutes.

TABLE 4

| Run No. | Heat Fusible Fiber (wt %) | Ni-Plated Acrylic Fiber (wt %) | CU-Content (wt %) | Sheet Weight (g/m²) | Sheet Thickness (mm) | Specific Volume (cm³/g) | Electromagnetic Interference Shielding Effect | | Surface Resistance (Ω/ ) |
|---|---|---|---|---|---|---|---|---|---|
| | | | | | | | Electric Field (dB) | Magnetic Field (dB) | |
| Sample 20 | 60 | 40 | 10 | 105 | 0.12 | 1.14 | 50.1 | 55.2 | 0.4–0.5 |
| Sample 21 | 60 | 40 | 10 | 400 | 0.45 | 1.13 | 68.9 | 74.5 | 0.2–0.3 |

While the invention has been described in detail and with reference to specific embodiments thereof, it will

TABLE 3

| Run No. | Heat Fusible Fiber (wt %) | Ni-Plated Acrylic Fiber (wt %) | Ni-Content (wt %) | Sheet Weight (g/m²) | Sheet Thickness (mm) | Specific Volume (cm³/g) | Electromagnetic Interference Shielding Effect | | Surface Resistance (Ω/ ) |
|---|---|---|---|---|---|---|---|---|---|
| | | | | | | | Electric Field (dB) | Magnetic Field (dB) | |
| Sample 17 | 60 | Fiber having a Y-type flattened cross section (40) | 8.0 | 371 | 0.36 | 0.97 | 43.5 | 52.0 | 3–6 |
| Sample 18 | 60 | Flattened fiber (40) | 8.0 | 421 | 0.36 | 0.86 | 41.0 | 48.0 | 8–10 |
| Comparative Sample 19 | 60 | Normal fiber (40) | 8.0 | 406 | 0.42 | 1.03 | 30.5 | 38.0 | 11–18 | be apparent to one skilled in the art that various changes

What is claimed is:

1. A conductive sheet having an electromagnetic interference shielding function, which consists of a nonwoven fabric consisting of 40 to 90 wt% of a heat fusible fiber comprising a vinyl chloride/vinyl acetate copolymer and 10 to 60 wt% of a metal-plated fiber having a fiber diameter of 3 to 50 μm and an aspect ratio of 1,000 to 10,000, wherein said nonwoven fabric is hot-press molded and wherein said conductive sheet has a metal content of 2 to 30% by weight and a specific volume of at most 2 cm$^3$/g.

2. A conductive sheet as in claim 1, wherein said metal-plated fiber has a fiber diameter of 5 to 20 μm and an aspect ratio of 2,000 to 6,000.

3. A conductive sheet as in claim 1, wherein said metal-plated fiber is produced by electroless plating a base fiber with a conductive metal.

4. A conductive sheet as in claim 3, wherein the base fiber is an acrylic fiber.

5. A conductive sheet as in claim 4, wherein the acrylic fiber is an acrylonitrile/vinylidene chloride copolymer fiber.

6. A conductive sheet as in claim 3, wherein the conductive metal is selected from the group consisting of nickel and copper.

7. A conductive sheet as in claim 3, wherein the ratio of the conductive metal for plating on the base fiber is in the range of 10 to 50% by weight of the metal-plated fiber.

8. A conductive sheet as in claim 3, wherein the base fiber possesses a flat cross section.

9. A conductive sheet as in claim 1, wherein said heat fusible fiber consists of 85 to 88% by weight of vinyl chloride and 12 to 15% by weight of vinyl acetate.

10. A conductive sheet as in claim 1, wherein at least one side of said conductive sheet is made into a film.

* * * * *